US006355543B1

(12) United States Patent
Yu

(10) Patent No.: US 6,355,543 B1
(45) Date of Patent: *Mar. 12, 2002

(54) LASER ANNEALING FOR FORMING SHALLOW SOURCE/DRAIN EXTENSION FOR MOS TRANSISTOR

(75) Inventor: Bin Yu, Fremont, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/162,919

(22) Filed: Sep. 29, 1998

Related U.S. Application Data

(63) Continuation of application No. 09/162,919, filed on Sep. 29, 1998.

(51) Int. Cl.[7] .................. H01L 21/336; H01L 21/428
(52) U.S. Cl. .................. 438/535; 438/303; 438/308; 438/528
(58) Field of Search .................. 438/558, 557, 438/550, 549

(56) References Cited

U.S. PATENT DOCUMENTS

| | | | | |
|---|---|---|---|---|
| 4,273,950 A | * | 6/1981 | Chitre .................. 136/255 |
| 4,502,898 A | * | 3/1985 | Camlibel et al. .................. 148/188 |
| 4,619,036 A | * | 10/1986 | Havemann et al. .................. 29/577 C |
| 4,737,470 A | * | 4/1988 | Bean .................. 438/510 |
| 4,774,195 A | * | 9/1988 | Beneking .................. 438/475 |
| 5,300,453 A | * | 4/1994 | Okamura et al. .................. 438/543 |
| 5,322,809 A | * | 6/1994 | Moslehi .................. 438/303 |
| 5,541,138 A | * | 7/1996 | Yamazaki et al. .................. 438/535 |
| 5,543,362 A | * | 8/1996 | Wu .................. 438/303 |
| 5,569,624 A | * | 10/1996 | Weiner .................. 438/285 |
| 5,597,762 A | * | 1/1997 | Popovici et al. .................. 438/105 |
| 5,672,541 A | * | 9/1997 | Booske et al. .................. 438/513 |
| 5,789,292 A | * | 8/1998 | Yamazaki et al. .................. 438/257 |
| 5,827,760 A | * | 10/1998 | Seo .................. 438/161 |
| 5,861,340 A | * | 1/1999 | Bai et al. .................. 438/592 |
| 5,908,307 A | * | 6/1999 | Talwar et al. .................. 438/199 |
| 5,918,140 A | * | 6/1999 | Wickboldt et al. .................. 438/535 |

* cited by examiner

*Primary Examiner*—Howard Weiss
*Assistant Examiner*—Marcos D. Pizarro-Crespo
(74) *Attorney, Agent, or Firm*—LaRiviere, Grubman & Payne, LLP

(57) ABSTRACT

A method for making a ULSI MOSFET chip includes forming a transistor gate on a substrate and defining the contours of shallow source/drain extensions by implanting a first pre-amorphization (PAI) substance into the substrate. A sidewall spacer is then formed on the substrate next to the gate, and a second PAI substance is implanted into the substrate to defame the contours of a deep source/drain junction. Then, a dopant is provided on the surface of the substrate, and the portions of the substrate that contain PAI substances are silicidized to render the portions relatively more absorbing of laser energy. These pre-amorphized portions are then annealed by laser to melt only the pre-amorphized portions. During melting, the dopant is driven from the surface of the substrate into the pre-amorphized portions to thereby establish source/drain regions below the gate.

16 Claims, 2 Drawing Sheets

LASER ANNEALING FOR FORMING SHALLOW SOURCE/DRAIN EXTENSION FOR MOS TRANSISTOR

RELATED APPLICATIONS

This application is a continuation of application No. 09/162,919, filed on Sep. 29, 1998, with the same title.

TECHNICAL FIELD

The present invention relates generally to semiconductor fabrication, and more particularly to methods for fabricating improved ultra-large scale integration (ULSI) semiconductor devices such as ULSI metal oxide silicon field effect transistors (MOSFETs).

BACKGROUND OF THE INVENTION

Semiconductor chips or wafers are used in many applications, including as processor chips for computers, and as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

A common circuit component of semiconductor chips is the transistor. In ULSI semiconductor chips, a transistor is established by forming a polysilicon gate on a silicon substrate, and then forming a source region and a drain region side by side in the substrate beneath the gate by implanting appropriate dopant materials into the areas of the substrate that are to become the source and drain regions. The gate is insulated from the source and drain regions by a thin gate oxide layer, with small portions of the source and drain regions, referred to as "extensions", extending toward and virtually under the gate. This generally-described structure cooperates to function as a transistor.

As the dimensions of MOSFETs desirably are reduced as discussed above, it will be readily appreciated that the depth to which the source and drain extensions of a transistor penetrates the silicon substrate decreases. While shallow source/drain extensions promote immunity from the deleterious ramifications of so-called short-channel effect and facilitate ever-smaller integrated circuits, unfortunately the limits of current ion implantation technology render it difficult at best to form ultra-shallow source/drain regions, i.e., regions having depths of 30 nanometers or less.

The present invention recognizes that laser annealing might instead be used to form ultra-shallow source/drain regions. However, the present invention understands that the use of a metal film to absorb the laser energy as has been proposed in other applications is undesirable. This is because the film must be stripped after use by a wet chemical etch, which adds cost and complexity, and the film and chemical process furthermore might possibly contaminate the silicon chip and render it less suitable for its intended purpose than might otherwise be hoped. Fortunately, the present invention recognizes that laser annealing can be used to precisely form ultra-shallow source/drain extensions without using a metal film.

BRIEF SUMMARY OF THE INVENTION

A method is disclosed for establishing at least one transistor on a semiconductor device. The method includes forming one or more MOS gates on a semiconductor substrate, and depositing dopant on first regions of the substrate. Then, a silicidizing substance is implanted in the first regions to silicidize the first regions. The method then envisions directing a laser beam against the first regions to move the dopant into the substrate for establishing source and drain regions.

In a preferred embodiment, a protective layer is deposited on the gate, and a first pre-amorphization (PAI) substance is implanted into the substrate prior to the step of depositing dopant. The protective layer substantially prevents implanting the first PAI substance through the layer into the gate. Also, a sidewall spacer is established on the gate after the step of implanting the first PAI substance, and then a second PAI substance is implanted into the substrate, with the protective layer and sidewall spacer substantially preventing implanting the second PAI substance through the layer and spacer. As described in greater detail below, the first PAI substance defines the contours of source and drain extensions, and the second PAI substance defines the contours of deep source/drain junctions.

In accordance with the present invention, the laser beam preferably is established such that regions with PAI substances (i.e., pre-amorphized regions) are at least partially melted thanks to the selective absorption of laser light induced by the silicidizing of these regions. The melting of the pre-amorphized regions causes the dopant to move into the pre-amorphized regions, and single crystal silicon regions are not melted, thereby substantially preventing the dopant from moving into the single crystal regions. If desired, the protective layer can be removed from the gate prior to implanting the dopant such that at least one dopant substance is implanted into the gate. A semiconductor device made according to the method, and a digital processing apparatus incorporating the semiconductor device, are also disclosed.

In another aspect, a method for making an ultra-large scale integration (ULSI) semiconductor device includes forming at least one gate on at least one semiconductor substrate, and pre-amorphizing first regions of the substrate while not pre-amorphizing second regions of the substrate. Dopant is provided on the substrate next to the gate. Then, the first regions are caused to at least partially melt, in contrast to the second regions, which do not melt, thereby causing the dopant to enter only the first regions.

In yet another aspect, a semiconductor device includes at least one transistor that in turn includes a gate disposed on a silicidized silicon substrate. The transistor further includes first regions that have dopant driven into them by virtue of the first regions having been melted by a laser. These first regions define source and drain regions for ULSI MOSFETs. Preferably, the first regions are pre-amorphized prior to laser annealing.

Other features of the present invention are disclosed or apparent in the section entitled "DETAILED DESCRIPTION OF THE INVENTION".

DETAILED DESCRIPTION OF THE INVENTION

Figure 1:
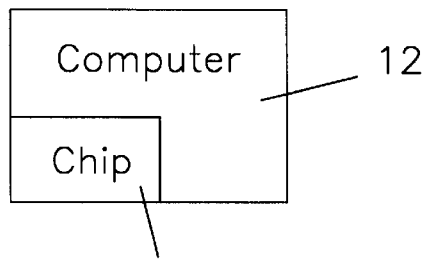
FIG. 1 is a schematic diagram of a semiconductor device made according to the present invention, shown in combination with a digital processing apparatus.

Referring initially to FIG. 1, a semiconductor device embodied as a chip is shown incorporated into a digital processing apparatus such as a computer, 12. The chip 10 is made in accordance with the below disclosure.

Figure 2:
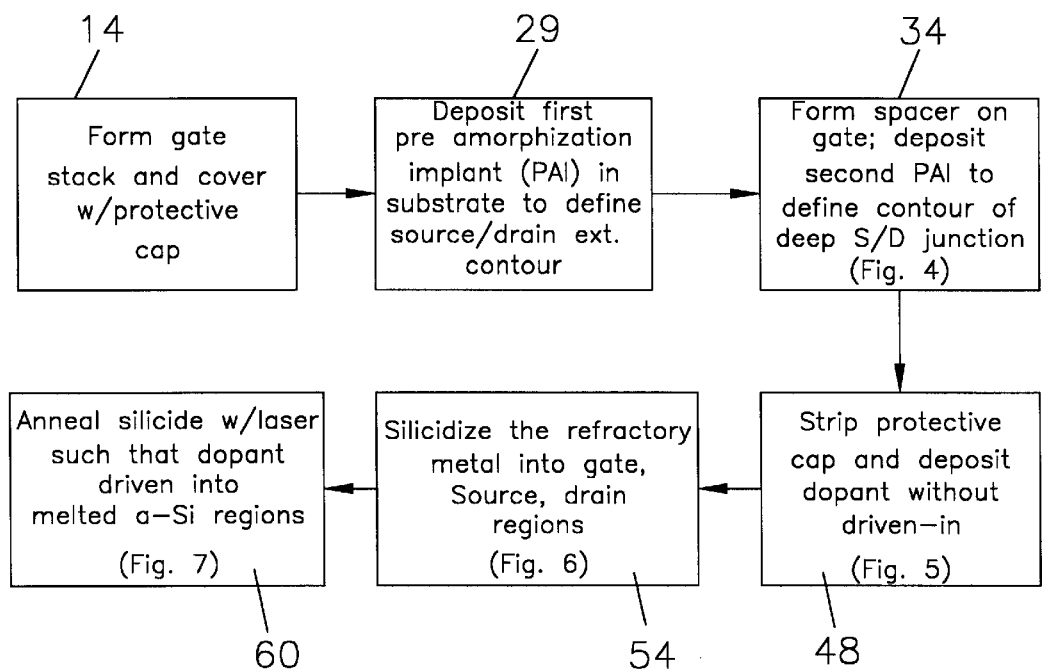
FIG. 2 is a flow chart showing the steps of the present invention.
Figure 3:
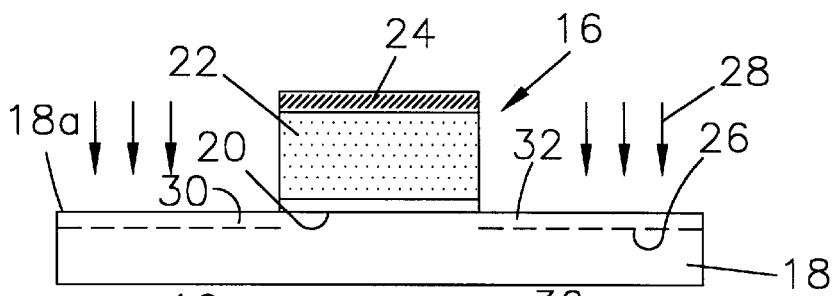
FIG. 3 is a side view of the device after the gate polysilicon and gate oxide has been formed, during implantation of the first PAI substance.

Now referring to FIGS. 2 and 3, as indicated at block 14 in FIG. 2 and as shown in FIG. 3, using conventional semiconductor fabrication techniques including low pressure chemical vapor deposition (LPCVD) and appropriate etching and lithography, a transistor gate, generally designated 16, is formed on a silicon or other semiconductor substrate 18. As shown, the gate 16 includes a thin insulating gate oxide layer 20 that faces the substrate 18 and a gate polysilicon stack 22 on the gate oxide layer 20.

Additionally, a protective silicon-oxy-nitride (SiON) cap 24 is deposited on the top of the gate 16. Then, a first pre-amorphization (PAI) substance such as high-dose silicon (Si) or germanium (Ge), represented by the dashed line 26, is implanted into the substrate 18 from the surface 18a of the substrate 18 down to the dashed line 26, as indicated by the arrows 28 and as shown at block 29 in FIG. 2. As intended by the present invention, the implantation of the pre-amorphization substance promotes the formation of and defines the contours of ultra-shallow source and drain extensions in extension regions 30, 32 during subsequent steps disclosed below. Those skilled in the art will recognize that the protective cap 24 substantially prevents implanting the pre-amorphization substance through the cap 24 into the gate 16.

Figure 4:
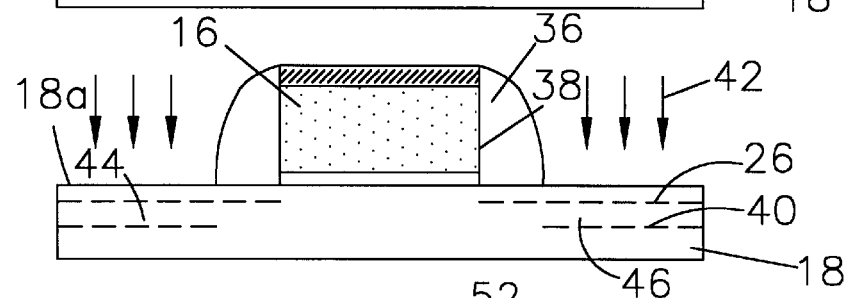
FIG. 4 is a side view of the device after the nitride spacers have been formed, during implantation of the second PAI substance.

Proceeding to block 34 an now referring to FIG. 4, nitride sidewall spacers 36 are deposited on the substrate 18 and etched in accordance with well-known principles to establish the illustrated shoulder configuration around the sides 38 of the gate 16. Next, a second PAI substance is implanted into the substrate 18 as represented by the dashed line 40 from the surface 18a of the substrate 18 down to the dashed line 40, as indicated by the arrows 42. The first and second PAI substances can be also a high-dose silicon (Si) or a germanium (Ge). Also, the cap 24 and spacers 36 prevent implanting the second PAI substance through the cap 24 and spacers 36. As understood herein, the second PAI substance promotes the formation and defines the contours of relatively deep source/drain junctions in deep regions 44, 46 of the substrate 18 during subsequent steps disclosed below.

Figure 5:
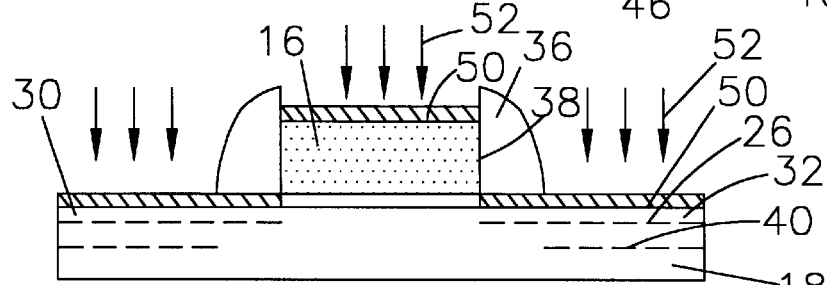
FIG. 5 is a side view of the device during deposition of the gate and source/drain dopant.

Following the above-described steps, the process moves to block 48 of FIG. 2, wherein the SiON protective cap 24 is removed from the gate 16 as shown in FIG. 5 by, e.g., wet etching. After removal of the protective cap 24, an appropriate dopant such as boron fluoride ($BF_2$), arsenic (As), boron (B), and phosphorous (P) or dopants, represented by heavy horizontal lines 50 in FIG. 5, is deposited onto the gate 16 and substrate 18, as indicated by the arrows 52. However, the dopant 50 is not driven into the substrate 18 at block 48.

Figure 6:
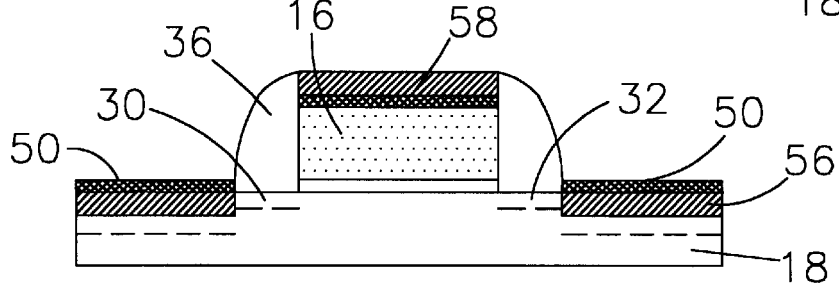
FIG. 6 is a side view of the device after silicidation.

Proceeding to block 54 of FIG. 2, most of the regions that are to become the source and drain regions (i.e., the regions that have been pre-amorphized as discussed above with the exception of the extension regions 30, 32 which are otherwise shielded by the sidewall spacers 36) are silicidized by depositing at least one refractory metal onto the gate 16 at the top region 58, the source region, and the drain region, and reacting the at least one refractory metal with the underlying silicon ions as indicated by cross-hatched areas 56 in FIG. 6. In one preferred embodiment, the silicidation is undertaken by sputtering a refractory material such as titanium or cobalt onto the areas/regions 56, 58.

As understood by the present invention, the silicide, which is already in wide use for other purposes in the semiconductor fabrication art and which accordingly does not introduce additional metal film deposition and etch-away steps, and which furthermore does not contaminate the substrate 16 in contrast to metal film, is a laser energy absorber. Moreover, as the skilled artisan will appreciate, the above-disclosed method steps result in the silicide laser absorber being self-aligned with the regions that will become the gate and source/drain regions. With this in mind, it may now be appreciated that laser energy will preferentially be absorbed precisely in the region that will become the gate and precisely in the pre-amorphized regions that will become the source/drain, owing to the silicidizing of these regions.

Figure 7:
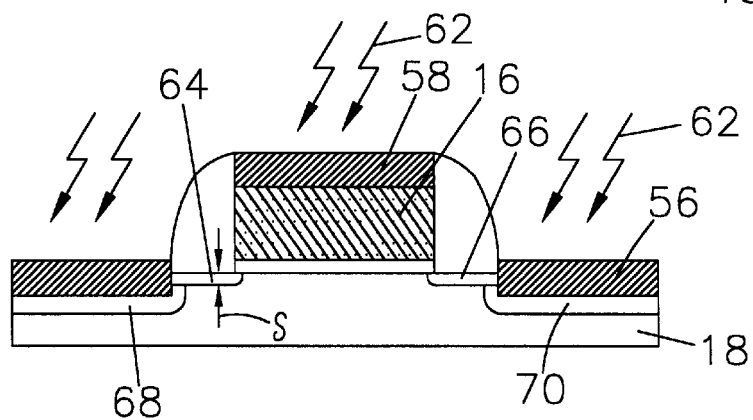
FIG. 7 is a side view of the device during laser annealing.

Moving to block 60 in FIG. 2 and now referring to FIG. 7, the gate 16 and substrate 18 are annealed with a laser beam, represented by the arrows 62. The silicidized regions 56, 58 selectively absorb the laser beam 62. In accordance with the preferred embodiment, the characteristics of the laser beam 62 are established such that pre-amorphized regions (referred to as α-Si), which have a lower melting point than single crystal silicon, are at least partially melted, whereas the laser beam 62 does not melt the single crystal silicon. This causes the dopant 50 (FIG. 5) to move into the pre-amorphized regions as well as to diffuse laterally into the extension regions 30, 32 (FIG. 5).

Consequently, under the influence of laser annealing at block 60, the extension regions 30, 32 become ultra-shallow (with thickness $\delta \leq 30$ nm) source/drain extensions 64, 66, as shown in FIG. 7, promoting superior short-channel performance. Also, the deep regions 44, 46 (FIG. 5) become source/drain junction regions 68, 70 as shown in FIG. 7. The dopant, however, substantially does not move into single crystal silicon regions. With the above-disclosed invention, no subsequent annealing steps such as high temperature annealing are required, because the dopant is activated during the laser annealing.

While the particular METHOD FOR FORMING SHALLOW SOURCE/DRAIN EXTENSION FOR MOS TRANSISTOR as herein shown and described in detail is fully capable of attaining the above-described objects of the invention, it is to be understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". Indeed, although a single transistor structure is shown in the drawings for clarity, the skilled artisan will appreciate that the chip 10 can include plural transistors, each substantially identical to that shown, as well as other circuit components. All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims.

What is claimed is:

1. A method for establishing at least one transistor on a semiconductor device, comprising:

forming at least one gate on a semiconductor substrate,
each at least one gate having a gate region,
each at least one gate having formed thereon a protective cap,
each at least one gate having a source region and a drain region laterally disposed in the substrate;

implanting a first pre-amorphization material in at least one first region of the substrate,
the at least one first region being shallow in a depth range no greater than 30 nm,
the protective cap preventing the first pre-amorphization material from being implanted into the gate,
the at least one gate and the at least one protective cap patterning the first pre-amorphization material implantation;

forming at least one sidewall spacer disposed laterally to the at least one gate;

implanting a second pre-amorphization material in at least one second region of the substrate,
the at least one second region being deep in a depth range greater than 30 nm,
the protective cap preventing the second pre-amorphization material from being implanted into the at least one gate,
the at least one sidewall spacer patterning the second pre-amorphization material implantation;

stripping the at least one protective cap;

depositing at least one dopant onto the at least one source region, the at least one drain region, and the at least one gate region;

depositing at least one refractory metal onto the at least one source region, the at least one drain region, and the at least one gate region;

silicidizing, by reacting, the at least one refractory metal with a plurality of silicon (Si) ions from the at least one source region, the at least one drain region, and the at least one gate region, thereby forming at least one refractory metal silicide on the dopant in the at least one first region and the at least one gate region; and annealing, by lasing, the at least one silicide,
whereby the at least one silicide provides at least one heat sink for preferentially absorbing laser energy, and
whereby laser energy absorption by the at least one silicide transfers heat for melting (amorphizing) the at least one first region and the at least one second region, for heating the at least one gate region,
thereby facilitating migration of the at least one dopant away from the at least one silicide and down into the at least one amorphized first region, the at least one amorphized second region, and the at least one heated gate region, and thereby respectively forming at least one shallow source/drain extension in a depth range no greater than 30 nm, at least one deep source/drain contact junction in a depth range greater than 30 nm, and at least one doped gate.

2. A method of claim 1, wherein the at least one protective cap comprises at least one material selected from a group of materials consisting essentially of an oxide and a silicon oxynitride (SiON).

3. A method of claim 1, wherein the at least one sidewall spacer comprises a nitride.

4. A method of claim 1, wherein the first and the second pre-amorphization materials comprise at least one material selected from a group of materials consisting essentially of high-dose silicon (Si) and germanium (Ge).

5. A method of claim 1, wherein the at least one dopant comprises at least one material selected from a group of materials consisting essentially of boron fluoride ($BF_2$), arsenic (As), boron (B), and phosphorous (P).

6. A method of claim 1,
wherein the at least one refractory metal is deposited by sputtering,
wherein the at least one refractory metal comprises at least one metal selected from a group of metals consisting essentially of titanium (Ti) and cobalt (Co), and
wherein the at least one silicide comprises at least one silicide selected from a group of silicides consisting essentially of titanium disilicide ($TiSi_2$) and cobalt disilicide ($CoSi_2$).

7. A method of claim 1, wherein the at least one silicide comprises a self-aligned silicide (salicide).

8. A method of claim 1, wherein at least one shallow source/drain extension is disposed in a shallow region of the substrate in a depth range no greater than 20 nm.

9. A method for fabricating an ultra-large scale integration (ULSI) semiconductor device, comprising:

forming at least one gate on a semiconductor substrate,
each at least one gate having a gate region,
each at least one gate having formed thereon a protective cap,
each at least one gate having a source region and a drain region laterally disposed in the substrate;

implanting a first pre-amorphization material in at least one first region of the substrate,
the at least one first region being shallow in a depth range no greater than 30 nm,
the protective cap preventing the first pre-amorphization material from being implanted into the gate,
the at least one gate and the at least one protective cap patterning the first pre-amorphization material implantation;

forming at least one sidewall spacer disposed laterally to the at least one gate;

implanting a second pre-amorphization material in at least one second region of the substrate,
the at least one second region being deep in a depth range greater than 30 nm,
the protective cap preventing the second pre-amorphization material from being implanted into the at least one gate,
the at least one sidewall spacer patterning the second pre-amorphization material implantation;

stripping the at least one protective cap;

depositing at least one dopant onto the at least one source region, the at least one drain region, and the at least one gate region;

depositing at least one refractory metal onto the at least one source region, the at least one drain region, and the at least one gate region;

silicidizing, by reacting, the at least one refractory metal with a plurality of silicon (Si) ions from the at least one source region, the at least one drain region, and the at least one gate region, thereby forming at least one refractory metal silicide on the dopant in the at least one first region and the at least one gate region;

annealing, by lasing, the at least one silicide, whereby the at least one silicide provides at least one heat sink for preferentially absorbing laser energy, and whereby laser energy absorption by the at least one silicide transfers heat for melting (amorphizing) the at least one first region and the at least one second region, for heating the at least one gate region, thereby facilitating migration of the at least one dopant away from the at least one silicide and down into the at least one amorphized first region, the at least one amorphized second region, and the at least one heated gate region, and thereby respectively forming at least one shallow source/drain extension in a depth range no greater than 30 nm, at least one deep source/drain contact junction in a depth range greater than 30 nm, and at least one doped gate; and completing fabrication of the semiconductor device.

10. A method of claim 9, wherein the at least one protective cap comprises at least one material selected from a group of materials consisting essentially of an oxide and a silicon oxynitride (SiON).

11. A method of claim 9, wherein the at least one sidewall spacer comprises a nitride.

12. A method of claim 9, wherein the first and the second pre-amorphization materials comprise at least one material selected from a group of materials consisting essentially of high-dose silicon (Si) and germanium (Ge).

13. A method of claim 9, wherein the at least one dopant comprises at least one material selected from a group of materials consisting essentially of boron fluoride ($BF_2$), arsenic (As), boron (B), and phosphorous (P).

14. A method of claim 9, wherein the at least one refractory metal is deposited by sputtering, wherein the at least one refractory metal comprises at least one metal selected from a group of metals consisting essentially of titanium (Ti) and cobalt (Co), and wherein the at least one silicide comprises at least one silicide selected from a group of silicides consisting essentially of titanium disilicide ($TiSi_2$) and cobalt disilicide ($CoSi_2$).

15. A method of claim 9, wherein the at least one silicide comprises a self-aligned silicide (salicide).

16. A method of claim 9, wherein at least one shallow source/drain extension is disposed in a shallow region of the substrate in a depth range no deeper than 20 nm.

* * * * *

UNITED STATES PATENT AND TRADEMARK OFFICE
CERTIFICATE OF CORRECTION

PATENT NO. : 6,355,543 B1
DATED : March 12, 2002
INVENTOR(S) : Bin Yu

It is certified that error appears in the above-identified patent and that said Letters Patent is hereby corrected as shown below:

<u>Title page,</u>
Item [57], ABSTRACT,
Delete "deframe" and replace with -- define --;

<u>Column 3,</u>
Line 13, after the word "chip", add -- 10 --;
Line 60, after the word "dopant", add -- or dopants --;
Line 61, after the word "(P)", delete "or dopants";

<u>Column 4,</u>
Line 40, delete "$\leqq$" and replace with -- $\leq$ --;

Signed and Sealed this

Fourth Day of June, 2002

*Attest:*

JAMES E. ROGAN
*Attesting Officer*     *Director of the United States Patent and Trademark Office*